United States Patent
Krochmal

[11] Patent Number: 5,856,759
[45] Date of Patent: Jan. 5, 1999

[54] AUDIO OUTPUT AMPLIFIER WITH PARALLEL CLASS AB STAGES

[75] Inventor: Andrew Cyril Krochmal, Plymouth, Mich.

[73] Assignee: Ford Motor Company, Dearborn, Mich.

[21] Appl. No.: 944,698

[22] Filed: Oct. 6, 1997

[51] Int. Cl.⁶ .................................................. H03F 3/68
[52] U.S. Cl. ..................... 330/124 R; 330/146; 381/28
[58] Field of Search ................. 330/146, 124 R, 330/124 D, 118, 263, 192, 148, 295, 69; 381/120, 28, 104, 413

[56] References Cited

U.S. PATENT DOCUMENTS

| | | |
|---|---|---|
| 4,376,267 | 3/1983 | Chu et al. . |
| 5,162,753 | 11/1992 | Khorramabadi . |
| 5,386,474 | 1/1995 | Grodinsky et al. ........................ 381/28 |
| 5,465,074 | 11/1995 | Maschmann et al. ................... 330/263 |
| 5,729,174 | 3/1998 | Dunnebacke et al. ..................... 330/51 |

OTHER PUBLICATIONS

Bridge/Parallel Amplifier (BPA–200) Documentation, National Semiconductor, Sep. 19, 1997.
SGS–Thomson Microelectronics, TDA7454, Apr., 1995, Data Sheet.
SGS–Thomson Microelectronics, TDA7374B, Apr., 1995, Data Sheet.
Phillips, TDA8566Q, Apr., 1996, Data Sheet.

*Primary Examiner*—Robert Pascal
*Assistant Examiner*—Patricia T. Nguyen
*Attorney, Agent, or Firm*—Mark Mollon

[57] ABSTRACT

A high output power is obtained for an audio power amplifier using an amplifier circuit topology wherein channels or stages of a multi-channel class AB monolithic integrated circuit are paralleled in order to drive a low impedance dual voice coil speaker. The stages are paralleled by connecting their outputs through isolation resistors. These resistors prevent the differences in output bias voltages from resulting in a short circuit from power to ground. In addition, the resistors are sufficiently small to achieve the correct speaker damping factor, yet large enough to prevent excessive quiescent current. The separate amplifier channels or stages are paralleled through isolation resistors which increases current drive resulting in a higher output power to the loud speaker.

6 Claims, 3 Drawing Sheets

AUDIO OUTPUT AMPLIFIER WITH PARALLEL CLASS AB STAGES

BACKGROUND OF THE INVENTION

The present invention relates in general to an audio power amplifier, and more specifically to an amplifier comprising monolithic integrated circuits providing high output power using parallel class AB output stages.

Automotive audio systems typically receive electrical power from low voltage electrical systems. This results in various difficulties in attempting to provide high levels of amplification in the audio system for driving output loudspeakers. Various techniques have been employed to overcome the problem of inadequate voltage headroom being available for the output audio amplifiers. For example, output power to the speaker can be increased by using a specially designed low impedance speaker. In the prior art however, only class D amplifier configurations have been used to drive low impedance speakers because only such a high efficiency amplifier could provide the current levels necessary to drive a low impedance speaker when using a low voltage supply. However, class D amplifiers are relatively expensive for use in automotive audio systems.

It is also known in the prior art to employ a switching power supply in the audio system to raise the supply voltage for the output amplifier to thereby increase output power to the speaker. However, switching power supplies have the disadvantages of greatly increased costs and increased electromagnetic interference.

Especially in automotive audio systems, it is preferable to construct amplifiers using monolithic integrated circuits. IC's provide the lowest cost and require the least amount of space due to the reduced number of components in an amplifier. However, monolithic IC amplifiers have been limited in the amount of output power which can be provided at the voltages used in automotive electrical systems. The lack of sufficient power is especially a problem for subwoofer speakers for which a loud sound pressure level is desired.

Monolithic IC's are available with bridged outputs for increasing output power. In the bridged configuration, the opposite speaker voice coil inputs are each driven by separate amplifier stages which have their polarity inverted. More specifically, each amplifier stage is biased at about one-half of the supply voltage and each amplifier stage amplifies the input signal in relation to the bias voltage but in an opposite sense with respect to the other amplifier stage. Bridged outputs increase the power applied to the speaker without needing a negative or split voltage supply. However, bridged amplifiers have still failed to provide sufficient output power for many applications, including subwoofer applications.

SUMMARY OF THE INVENTION

The present invention has the advantage of providing increased output power using monolithic integrated circuits wherein bridged class AB amplifier stages may be connected in parallel to increase drive current to an output speaker. Prior to the present invention, differences in bias voltages of separate class AB amplifier stages prevented paralleling of stages.

In a primary aspect of the invention, an audio power amplifier having positive and negative power outputs is connected to a voice coil of a loud speaker. A monolithic audio amplifier integrated circuit includes first and second bridged class AB amplifier stages, each stage having respective positive and negative bridge outputs. An isolation network couples the first and second bridged class AB amplifier stages in parallel to the power outputs. The isolation network includes a first isolation element coupled between the positive bridge outputs of the first and second bridged class AB amplifier stages and a second isolation element coupled between the negative bridge outputs of the first and second bridged class AB amplifier stages. The isolation elements have impedance magnitudes which provide a balance between limiting quiescent currents caused by any inequality in bias voltages of the first and second bridged class AB amplifier stages and maintaining an acceptable electrical damping factor of the loudspeaker.

DETAILED DESCRIPTION OF PREFERRED EMBODIMENTS

Figure 1:
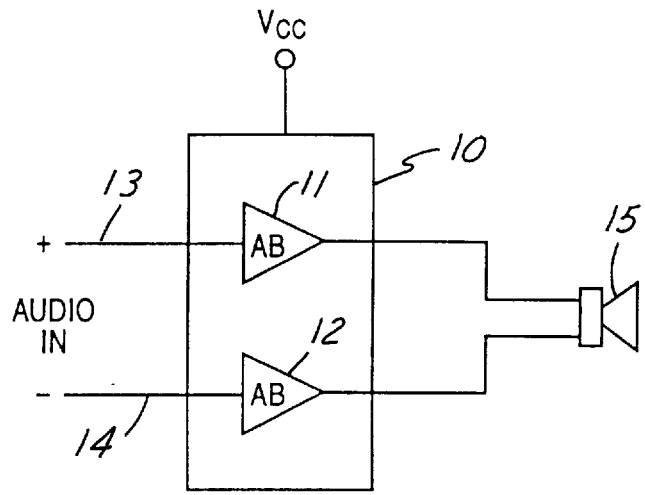
FIG. 1 is a block diagram showing a prior art bridged amplifier using class AB amplifier stages.

Referring to FIG. 1, a monolithic integrated circuit 10 provides an audio power amplifier including a class AB amplifier stage 11 and a class AB amplifier stage 12. As is known in the art, each class AB amplifier stage is comprised of a push-pull amplifier wherein each half of the push-pull amplifier conducts for more than one-half cycle of an output waveform. Each class AB amplifier stage is biased to a bias voltage about halfway between power supply voltage $V_{cc}$ and ground.

The amplifier stages in FIG. 1 are in a bridged configuration wherein amplifier stage 11 receives an audio input signal 13 while class AB amplifier stage 12 receives an inverted audio input signal 14. Amplifier stages 11 and 12 drive opposite sides of an output loudspeaker 15. Using bridged amplifier stages increases the power output that can be supplied to loudspeaker 15 from a monolithic integrated circuit. However, output power is still insufficient for many applications unless supply voltage $V_{cc}$ is increased or unless more expensive circuitry or integrated circuit fabrication techniques are employed.

Figure 2:
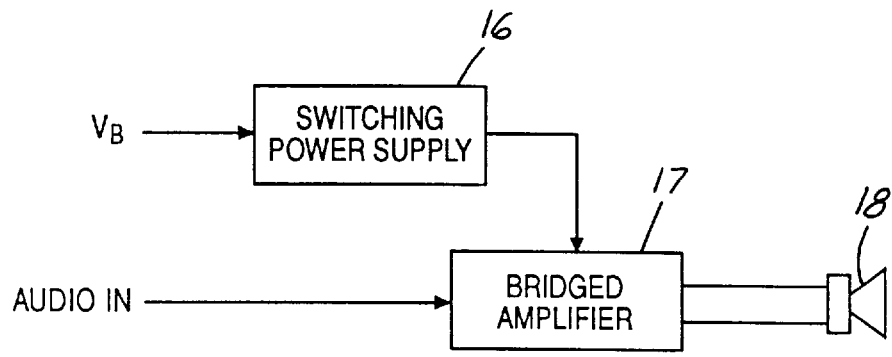
FIG. 2 is a block diagram showing a stepped-up voltage amplification system as used in the prior art.

FIG. 2 illustrates the solution of increasing supply voltage to increase output power. The battery voltage $V_b$, such as 14 volts in an automotive electrical system, is supplied to a switching power supply 16 which steps up the voltage (e.g., to a value of about 40 volts). The stepped-up voltage is provided to a bridged amplifier IC 17 which amplifies the audio input and drives loudspeaker 18 with an increased sound pressure level from the speaker.

Figure 3:
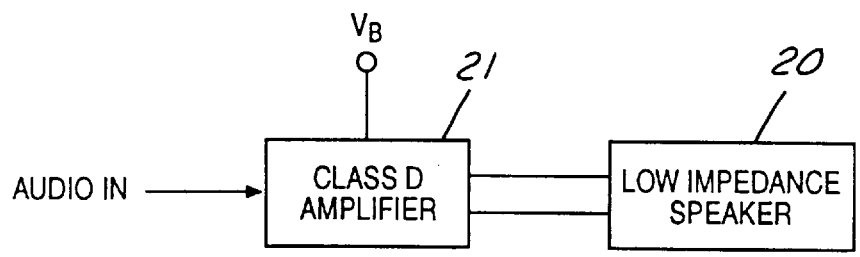
FIG. 3 is a block diagram showing a prior art amplifier using a low impedance speaker.

FIG. 3 shows an alternative prior art solution wherein a low impedance speaker 20 is driven by a high efficiency class D amplifier 21. With the reduced impedance from the speaker, a higher current can be made to flow through the speaker even with a low 14 volt battery voltage $V_b$ supplied to amplifier 21. Nevertheless, an expensive class D amplifier has been employed in the prior art in order to produce sufficient current levels for amplifying the audio signal.

Of the various amplifier configurations commonly available as integrated circuits, the class AB amplifier is the most advantageous for automotive audio systems because it obtains the best trade-off in cost, performance, and efficiency. Output current from amplifiers can be increased by connecting a plurality of amplifiers in parallel. However, class AB amplifier outputs cannot be connected in parallel for various reasons.

Figure 4:
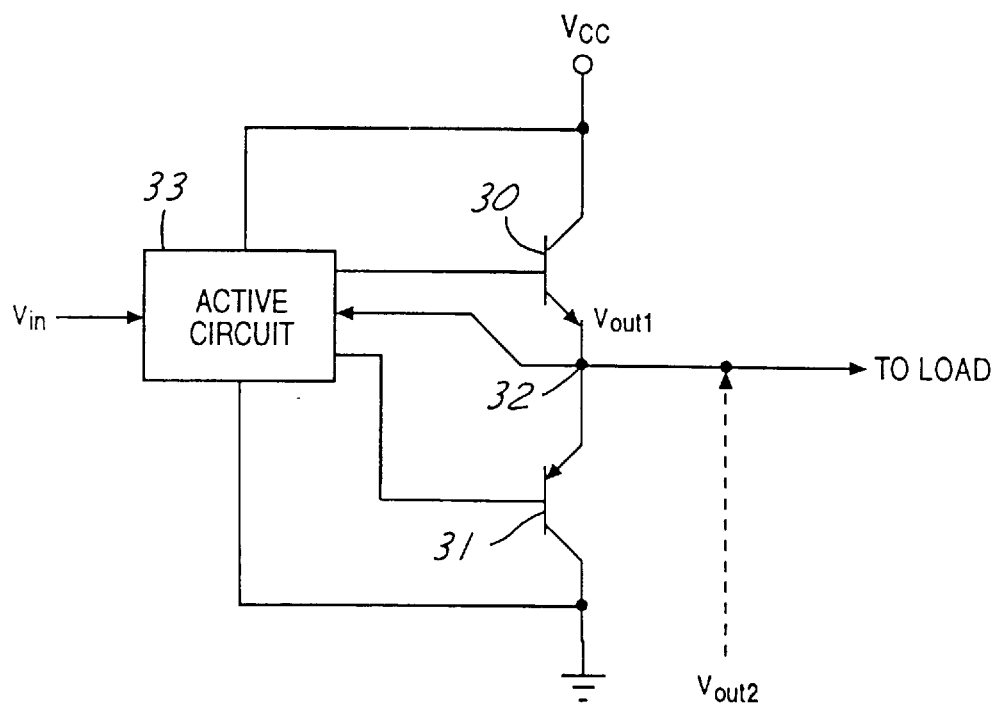
FIG. 4 is a schematic diagram showing a class AB amplifier stage which illustrates the problem of connecting stages in parallel.

FIG. 4 shows a typical class AB amplifier stage including a push-pull pair of transistors 30 and 31 connected in series between supply voltage $V_{cc}$ and ground. A junction 32 between transistors 30 and 31 provides the amplifier output and has an output voltage $V_{out1}$. An active circuit 33 receives the input audio signal $V_{in}$ and controls transistors 30 and 31 to provide the proper bias of the amplifier and to control amplification of input signal $V_{in}$. Active circuit 33 is connected to junction 32 for obtaining feedback to monitor the bias level of the amplifier. Active circuit 33 derives a reference voltage internally for comparison with $v_{out1}$ to provide control of the bias level.

If two class AB amplifier stages of the type shown in FIG. 4 were connected in parallel, then a second amplifier stage would provide an output voltage $v_{out2}$ also to junction 32. Since the second amplifier stage would have its own reference voltage within its active circuit for setting the bias voltage, improper operation results. The voltage reference used by the two respective active circuits will always have a small difference. However, each active circuit will be monitoring the same voltage and will attempt to compensate it in a manner to achieve its desired voltage. A short to ground will result between the power supply and ground due to the fact that the amplifier stage with the higher voltage reference will attempt to increase the output voltage while the amplifier stage with the lower voltage reference will simultaneously attempt to lower the same output voltage. Neither will be successful and the active circuits will increase the drive current to transistors on opposite sides of the push-pull arrangement until a short from power supply to ground results. Even the tiny differences in reference voltages between amplifier stages formed on the same monolithic integrated circuit are sufficient to result in such a short ground.

Figure 5:
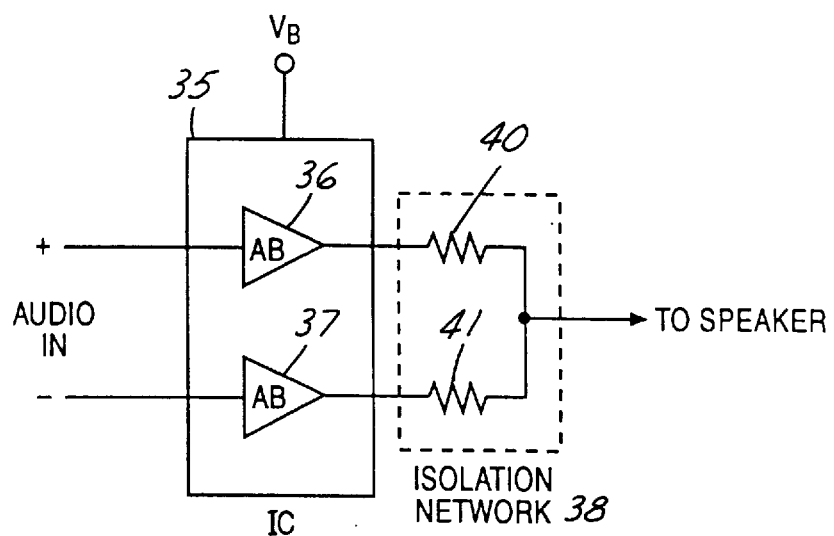
FIG. 5 is a schematic diagram showing paralleled amplifier stages of the present invention.

Nevertheless, differences in reference voltages between stages on the same monolithic integrated circuit are sufficiently small that the problem can be overcome using an isolation network according to the present invention as shown in FIG. 5. A monolithic integrated circuit 35 includes class AB amplifier stages 36 and 37. The amplifier stages are not bridged in this example but are connected in parallel to the same side of the speaker load through an isolation network 38. In the present embodiment, isolation network 38 includes a pair of resistors 40 and 41 each connected to respective outputs of amplifier stages 36 and 37. The resistors isolate the amplifier outputs and allow them to each successfully maintain their desired bias voltage while still permitting the output currents of the two amplifiers to be added in parallel. The resistance value of resistors 40 and 41 are selected to provide sufficient isolation while not unnecessarily increasing quiescent amplifier current or negatively affecting the damping factor of the speaker. The damping factor relates to the ability of the amplifier output to control the speaker voltage and is equal to the ratio of the speaker impedance to the amplifier's output impedance. Typically, a damping factor greater than or equal to about 10 is desired (although lower values down to 5 or less may be tolerable for some applications). Thus, the resistance of the isolation network as seen from the speaker is preferably less than or equal to about 10% of the speaker resistance.

Figure 6:
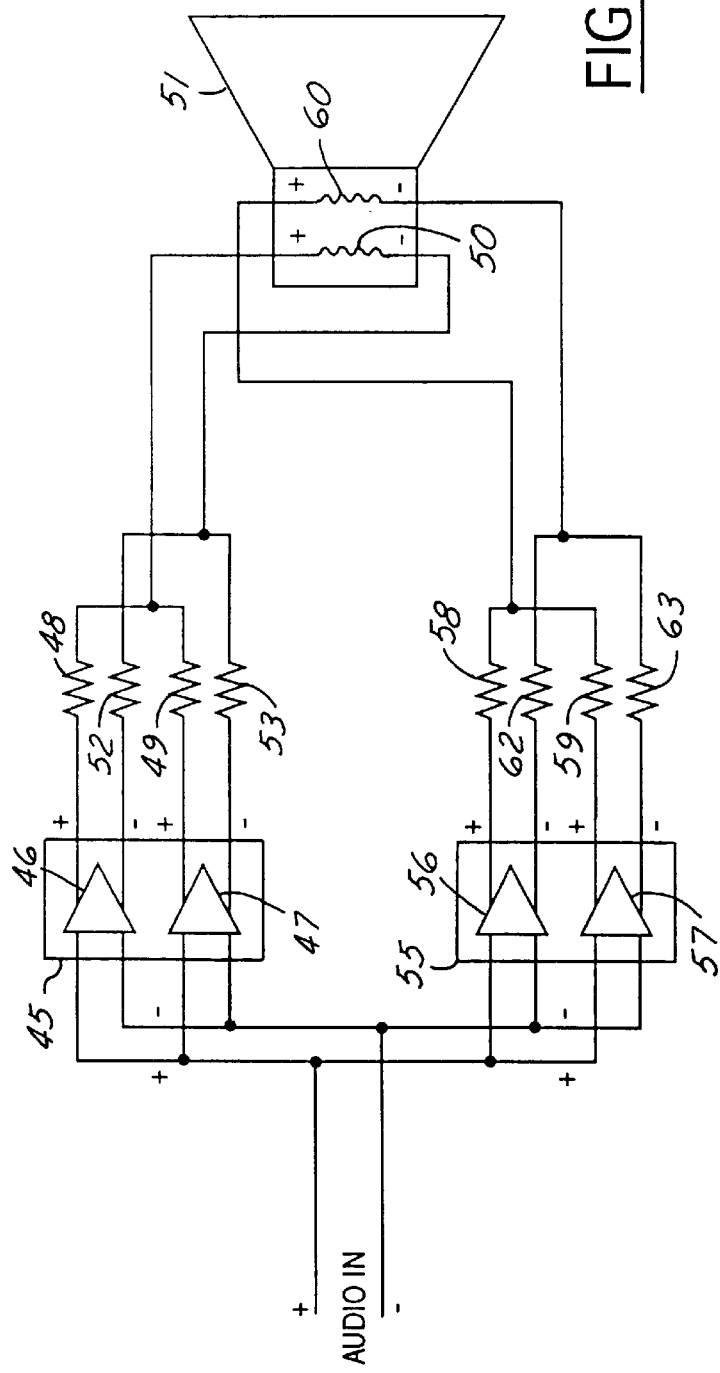
FIG. 6 is a schematic diagram showing bridged amplifiers connected in parallel and connected to a dual voice coil speaker according to the present invention.

FIG. 6 shows an embodiment of the present invention using bridged class AB amplifiers connected in parallel to provide a high output power. In addition, a dual voice coil speaker is used with separate bridged paralleled amplifiers driving each separate voice coil for further increase in output power while using only conventional class AB bridged amplifier IC's. This results in a very low cost amplifier with very high output power and excellent performance.

A first monolithic IC 45 includes bridged class AB amplifier stages 46 and 47. Non-inverted (+) and inverted (−) audio inputs are coupled to the inputs of amplifier stages 46 and 47. The non-inverted outputs of stages 46 and 47 are coupled to isolation resistors 48 and 49, respectively. The junction of isolation resistors 48 and 49 is connected to the positive side of a voice coil 50 in a dual voice coil speaker 51. The inverted outputs of stages 46 and 47 are connected to isolation resistors 52 and 53 which have their outputs each connected to the negative side of voice coil 50. Likewise, a second monolithic integrated circuit 55 includes bridged class AB amplifier stages 56 and 57 receiving the non-inverted and inverted audio input signals as shown. Isolation resistors 58 and 59 are connected to the non-inverted outputs of amplifier stages 56 and 57 and provide an output to the positive side of a voice coil 60. Isolation resistors 62 and 63 connect the inverted outputs of amplifier stages 56 and 57 to the negative side of voice coil 60.

Voice coils 50 and 60 are preferably constructed to provide a lower than typical speaker impedance, such as about one ohm, for example. The combination of low speaker impedance, paralleled class AB amplifiers, and dual voice coils driven by separate bridged amplifiers, all result in a very high speaker power and sound pressure level at an ultra low cost. For example, in one automotive application, the cost savings is estimated at $5.00 per audio system versus prior art solutions. The invention allows conventional class AB amplifier monolithic integrated circuits to be used in applications that used to require specialized and costly components.

When using isolation resistors in a balanced configuration as shown in FIG. 6 (i.e. with a separate resistor connected to each amplifier output), the speaker voice coils see each pair of resistors in parallel and therefore the parallel resistance of the two resistors is preferably less than or equal to 10 % of the speaker voice coil resistance in order to provide adequate damping factor. A total resistance at 10 % will typically be large enough to prevent excessive quiescent current flow in the amplifiers.

Figure 7:
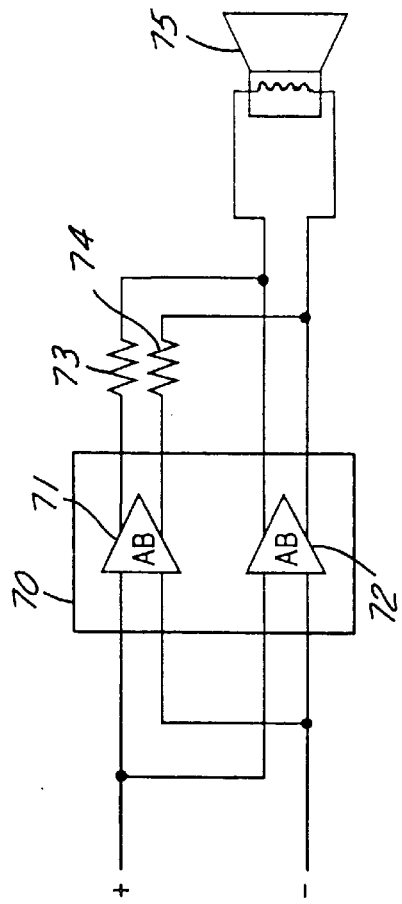
FIG. 7 is a schematic diagram showing an alternative isolation network of the present invention.

FIG. 7 shows an alternative embodiment wherein the number of resistors in the isolation network is reduced by connecting a single resistor to one amplifier output of each paralleled pair. Thus, a monolithic IC 70 includes class AB amplifier stages 71 and 72. The non-inverting outputs of stages 71 and 72 are connected together through a single isolation resistor 73 while the inverting outputs are connected through a single isolation resistor 74. A loudspeaker 75 is shown including a single voice coil; however, a dual voice coil could also be used for this embodiment.

The present invention is practical only when paralleling amplifier channels from the same monolithic integrated circuit. Otherwise, larger differences in bias voltages are seen which would require larger isolation resistors and would result in larger quiescent currents and greater heat dissipation which would limit the drive capability of the integrated circuit.

Although resistors are shown as the components within the isolation network, other devices could be used such as active devices.

What is claimed is:

1. An audio power amplifier having positive and negative power outputs for connecting to a voice coil of a loudspeaker, comprising:

a monolithic audio amplifier integrated circuit including first and second bridged class AB amplifier stages, each stage having respective positive and negative bridge outputs; and an isolation network coupling said first and second bridged class AB amplifier stages in parallel to said power outputs, said isolation network including a first isolation element coupled between said positive bridge outputs of said first and second bridged class AB amplifier stages and a second isolation element coupled between said negative bridge outputs of said first and second bridged class AB amplifier stages;

wherein said isolation elements have impedance magnitudes which provide a balance between limiting quiescent currents caused by inequality in bias voltages of said first and second bridged class AB amplifier stages and maintaining an electrical damping factor of said loudspeaker.

2. The audio power amplifier of claim 1 wherein said isolation elements are comprised of discrete resistors.

3. The audio power amplifier of claim 1 wherein said impedance magnitudes provide a value of said damping factor greater than or equal to about 5.

4. An audio power amplifier for connecting to a loudspeaker having first and second voice coils, comprising:

a first monolithic audio amplifier integrated circuit including first and second bridged class AB amplifier stages, each stage having respective positive and negative bridge outputs;

a second monolithic audio amplifier integrated circuit including third and fourth bridged class AB amplifier stages, each stage having respective positive and negative bridge outputs;

a first isolation network coupling said first and second bridged class AB amplifier stages in parallel to said first voice coil, said first isolation network including a first isolation element coupled between said positive bridge outputs of said first and second bridged class AB amplifier stages and a second isolation element coupled between said negative bridge outputs of said first and second bridged class AB amplifier stages;

a second isolation network coupling said third and fourth bridged class AB amplifier stages in parallel to said second voice coil, said second isolation network including a third isolation element coupled between said positive bridge outputs of said third and fourth bridged class AB amplifier stages and a fourth isolation element coupled between said negative bridge outputs of said third and fourth bridged class AB amplifier stages;

wherein said isolation elements have impedance magnitudes which provide a balance between limiting quiescent currents caused by inequality in bias voltages of said bridged class AB amplifier stages and maintaining an electrical damping factor of said loudspeaker.

5. An audio power amplifier having positive and negative power outputs for connecting to a voice coil of a loudspeaker, comprising:

a monolithic audio amplifier integrated circuit including first and second bridged class AB amplifier stages, each stage having respective positive and negative bridge outputs; and an isolation network coupling said first and second bridged class AB amplifier stages in parallel to said power outputs, said isolation network including a first isolation element coupling said positive bridge output of said first bridged class AB amplifier stage to said positive power output, a second isolation element coupling said positive bridge output of said second bridged class AB amplifier stage to said positive power output, a third isolation element coupling said negative bridge output of said first bridged class AB amplifier stage to said negative power output, and a fourth isolation element coupling said negative bridge output of said second bridged class AB amplifier stage to said negative power output;

wherein said isolation elements have impedance magnitudes which provide a balance between limiting quiescent currents caused by inequality in bias voltages of said first and second bridged class AB amplifier stages and maintaining an electrical damping factor of said loudspeaker.

6. The audio power amplifier of claim 5 wherein said isolation elements are each comprised of a resistor having a resistance of about 0.2·R, where R is the resistance of said voice coil.

* * * * *